United States Patent
Shiralagi et al.

(10) Patent No.: US 6,265,329 B1
(45) Date of Patent: Jul. 24, 2001

(54) QUANTUM DEPOSITION DISTRIBUTION CONTROL

(75) Inventors: Kumar Shiralagi, Chandler; Raymond K. Tsui, Phoenix, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/036,947

(22) Filed: Mar. 9, 1998

(51) Int. Cl.$^7$ .................................................. H01L 21/203
(52) U.S. Cl. ............................ 438/962; 438/22; 438/34; 438/35; 438/36
(58) Field of Search .................... 438/962, 22, 29, 438/34, 35, 36, 46

(56) References Cited

U.S. PATENT DOCUMENTS

| | | | | |
|---|---|---|---|---|
| 5,614,435 | * | 3/1997 | Petroff | 437/110 |
| 5,783,840 | * | 7/1998 | Randall | 257/24 |
| 5,831,294 | * | 11/1998 | Ugajin | 257/191 |
| 5,888,885 | * | 3/1999 | Xie | 438/493 |
| 5,905,273 | * | 5/1999 | Hase | 257/24 |
| 6,020,605 | * | 2/2000 | Ugajin | 257/191 |
| 6,244,530 | * | 4/2001 | Goronkin | 257/17 |

FOREIGN PATENT DOCUMENTS

| | | | | |
|---|---|---|---|---|
| 0-588062-A1 | * | 11/1993 | (EP) | H01L/29/14 |
| 10-289998 | * | 10/1998 | (JP) | H01L/21/203 |

OTHER PUBLICATIONS

"Positioning of InAs Quantum Dots on Sub–250 Facets using Selective Area Epitaxy", Tsui, p. 531–534, 1998, IEEE Journal of Quantum Electronics.*

* cited by examiner

Primary Examiner—Mary Wilczewski
Assistant Examiner—David Goodwin
(74) Attorney, Agent, or Firm—Eugene A. Parsons; William E. Koch

(57) ABSTRACT

A sparse-carrier device comprising a crystal structure formed of a first material and including a crystallographic facet having a length, a first width and a second width, and quantum dots formed of a second material and positioned on the crystallographic facet, the quantum dots extending along the length of the crystallographic facet in a first distribution pattern along the first width and a second distribution pattern along the second width.

14 Claims, 3 Drawing Sheets

QUANTUM DEPOSITION DISTRIBUTION CONTROL

BACKGROUND OF THE INVENTION

1. Field of the Invention

This invention relates generally to devices that operate through the conduction of a very small number of electrical carriers and to methods of fabricating, and controlling the fabrication of, the devices.

2. Background of the Invention

A relatively recent development in material science has been the ability to fabricate structures that are small on a quantum scale. On this small scale, 200Å or less, the applicable physics is neither that of the solid state bulk nor that of the gaseous-free atom, but rather that of a quantum-confined intermediate. Early in the development, these small-scale structures were formed in layers with confinement in one dimension only. The confined structures are typically composed of thin layers produced by MBE equipment on GaAs or other active substrates.

As an example of a use of these thin layers, lasers have been made that utilize the quantum confinement layers for carrier confinement or refractive optical confinement. In quantum-mechanically confined nano-structures, the degree of freedom in the free-electron motion decreases as N, the number of confined dimensions, goes up. This change in the electronic density of states has long been predicted to increase efficiency and reduce temperature sensitivity in lasers, and has been demonstrated for N=1 and 2. The techniques for the production of very thin layers of material with reasonable electronic mobilities require very meticulous crystal growth and exceedingly high purity.

For the ultimate case of N=3, there is also the occurrence of Coulomb blockade, a phenomenon that provides the basis for the operation of single-electron devices. Generally, a 3-D confined nano-structure is a small particle of material, e.g., semiconductor material, that is small enough to be quantum confined in three dimensions. That is, the quantum-contained particle has a diameter that is only about 200Å or less. This creates a three-dimensional well with quantum confinement in all directions.

Traditionally, attempts to fabricate 3-D confined nano-structures relied on e-beam lithography. More recently, STM/AFM and self-assembled quantum dots (3-D confined nano-structures) have been fabricated. However, incorporating the 3-D confined nano-structures into a useful device is very difficult and has not been accomplished in a manufacturable process.

Accordingly, it would be very beneficial to be able to efficiently manufacture 3-D confined nano-structures in a useful device.

It is a purpose of the present invention to provide 3-D confined nano-structures in a useful device.

It is another purpose of the present invention to provide a new and efficient method of manufacturing 3-D confined nano-structures.

It is still another purpose of the present invention to provide a new and efficient method of controlling the manufacture of 3-D confined nano-structures.

SUMMARY OF THE INVENTION

The above problems and others are at least partially solved and the above purposes and others are realized in a sparse-carrier device including a crystal structure formed of a first material and including a crystallographic facet having a length, a first width and a second width, and quantum dots formed of a second material and positioned on the crystallographic facet, the quantum dots extending along the length of the crystallographic facet in a first distribution pattern along the first width and a second distribution pattern along the second width. In a specific embodiment, the first width is greater than the second width wherein the first distribution pattern correspondingly includes a greater number of dots than the second distribution pattern. In another embodiment, the first width is less than the second width wherein the first distribution pattern correspondingly includes a lesser number of dots than the second distribution pattern. The quantum dots, and the varying distribution patterns of quantum dots located in the first and second widths of the crystallographic facet, form a building block for circuits based on sparse or single electron devices. Generally, electrical connections may be provided to the quantum dots for the passage of electrical carriers or the propagation of changes in polarization states therealong, depending upon the operation.

Consistent with the foregoing, associated methods may also be provided.

BRIEF DESCRIPTION OF THE DRAWINGS

The foregoing and further and more specific objects and advantages of the instant invention will become readily apparent to those skilled in the art from the following detailed description thereof taken in conjunction with the drawings in which.

DETAILED DESCRIPTION OF A PREFERRED EMBODIMENT

Figure 1:
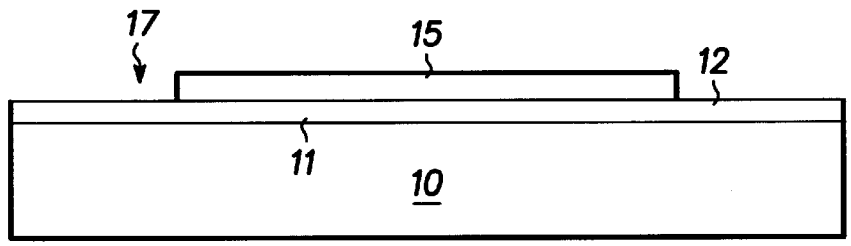
FIGS. 1 through 4 are greatly enlarged, simplified sectional views illustrating a preferred method of patterning a substrate for further processing, in accordance with the present invention.

Turning now to the drawings, FIGS. 1–4 illustrate several steps in a preferred method of masking a gallium arsenide substrate 10 for the fabrication of sparse carrier devices. While the present masking method is utilized because of its convenience (the substrate does not have to be removed from the growth chamber throughout the operation), other masking methods known in the semiconductor art may be utilized, if desired. It should be understood that gallium arsenide substrate 10 is utilized herein for purposes of this description, but other III–V compounds and other semiconductor materials may be utilized in other applications. Referring specifically to FIG. 1, a simplified sectional view of gallium arsenide substrate 10 having a surface 11 is illustrated. It should be understood that substrate 10 might simply be a supporting structure, such as a wafer or the like, or it might include various layers (not shown) formed on or in the supporting structure.

Surface 11 of gallium arsenide substrate 10 has a film 12 (generally 20Å or less) of a native oxide which, as is well known in the art, forms substantially instantaneously upon exposure to air. The native oxide is not necessary to the present invention and is only illustrated because it is generally present and requires special procedures to prevent. In some applications, various types of passivation may be used to prevent the formation of film 12, in which case such passivation may have to be removed before the present procedure can be performed. It has been found that the present technique will operate generally as described with the surface simply being clean (i.e., no foreign matter).

While substrate 10 can be patterned utilizing a variety of methods including with or without resist (nitride), the following example of resistless patterning is included as a preferred embodiment. A mask 15 is positioned adjacent to surface 11 of substrate 10 for patterning surface 11, as will be explained presently. Mask 15 generally is a shadow or metal mask but, in some special applications, it can be formed in the well known manner with photolithography as in an aligner or stepper (generally includes a projected image from a mask). As will become apparent presently, one of the major advantages of the present technique is that photolithography and the like are not necessary for the described masking operations. In the preferred embodiment, mask 15 is a mask plate with metal lines and other features, for example, a chrome mask. In any case, mask 15 is positioned adjacent surface 11 so as to defined one or more growth areas or openings 16 on surface 11 beneath mask 15 and one or more unmasked portions 17 on surface 11 of substrate 10.

Figure 2:
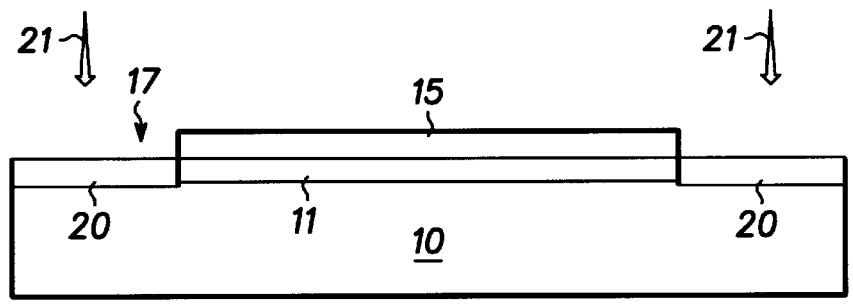

Unmasked portions 17 of surface 11 are exposed to a bright light preferably including deep ultraviolet, represented by arrows 21 in FIG. 2. The bright light may be, for example, the type typically used in aligners, steppers, or E-beam devices in the semiconductor industry. The term deep ultraviolet refers to light in the ultraviolet range, generally with a wavelength in the range of 180 to 250 nanometers (nm). It is believed that exposure to other wavelengths, such as 248 nm in a specific example, modifies the composition of the surface oxide by forming a different kind of oxide or complex oxide molecules that are more stable than the native oxide. The exposure to light can be performed under a lamp. However, when the light is collimated, as in an aligner or stepper, sharp features can be defined in unmasked portion 17 or in masked portion 16 by mask 15. In this specific example, gallium arsenide wafer 10 with layer 12 of native oxide on the surface was provided. Standard bright lights, both at 185 nm and at 248 nm, were used with the wafer being exposed through a chrome coated mask for 5 minutes. Oxide film 20 with a thickness less than approximately 2 nm was produced in the unmasked areas.

Figure 3:
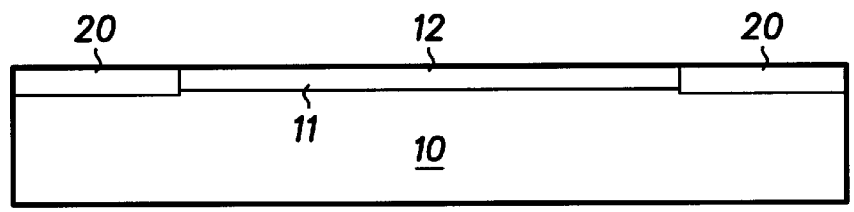

Once oxide film 20 is grown, mask 15 is removed to expose growth areas or openings 16, as illustrated substantially in FIG. 3. Oxide film 20 then serves as a mask for further process operations, such as growth, etching, and so on, and can be easily removed in situ by heating, if necessary. As an example of further operations, substrate 10 is then introduced into a growth chamber (not shown) and heated to a temperature of approximately 580° C. to desorb any native oxide that may still be present in growth area 16 as illustrated in FIG. 4.

Figure 6:
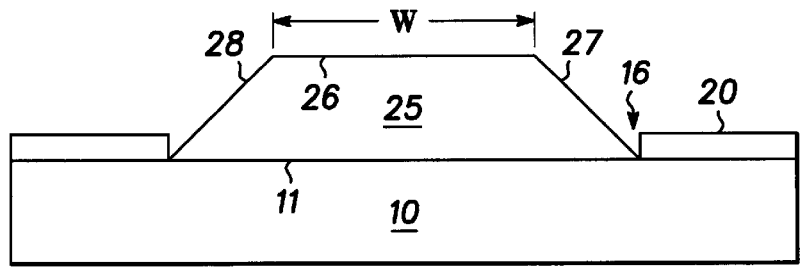
FIG. 6 is a greatly enlarged, simplified sectional view illustrating crystalline material selectively grown on the patterned substrate of FIG. 4, in accordance with the present invention.

While retaining substrate 10 in the growth chamber, selective growth of crystalline, or semiconductor, material 25 in growth area 16 is performed, as illustrated in FIG. 6. With oxide film 20 in place as a mask for further growth, a predetermined amount of crystalline material 25 is selectively grown in area (or areas) 16. For the purposes of this disclosure, selective growth or selectively grown is defined as growing only in the specific or designated area 16. In this specific example, GaAs is grown using selective area epitaxy (SAE) and well defined crystallographic facets develop while no growth occurs on oxide film 20. Further, since material 25 grows in a crystalline form, growth rates and shapes are crystallographically dependent, i.e., the rate and shape of growth are dependent upon the type of material 25 being utilized.

Figure 5:
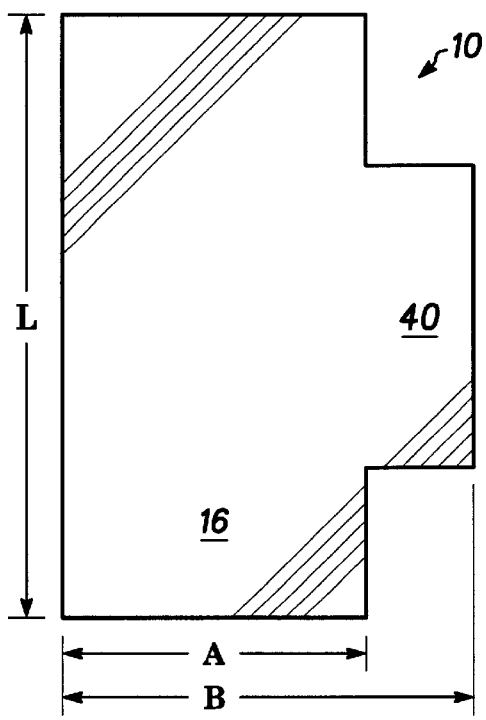
FIG. 5 is a greatly enlarged, simplified top elevational view of a substrate patterned for processing, in accordance with the present invention.

To achieve deposition of material 25 in well defined areas and to control the dimension of crystallographic facets, growth area 16 may be geometrically defined to have not only a predetermined length, but also one or more predetermined widths prior to material 25 deposition. In a specific example as shown in FIG. 5, growth area 16, as defined by mask 15, includes a length L, a first width A formed along substantially the entire length of growth area 16, and a substantially centrally disposed second width B defined by an extension 40. For the purposes of illustration as shown in FIG. 5, first width A is greater than second width B.

Figure 4:
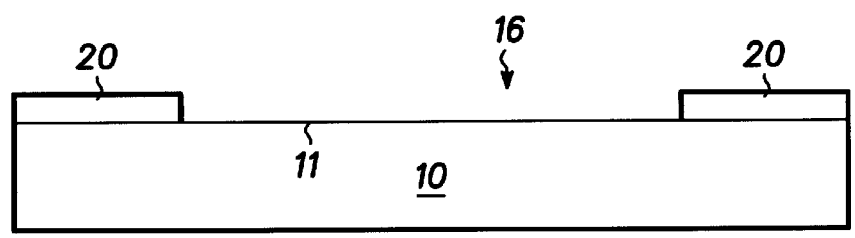

In the specific example illustrated in FIG. 4, first width A of growth area 16 is approximately 1 micron wide and may extend lengthwise (into and out-of the figure) as far as described, and second width B is somewhat greater than 1 micron wide (shown only in FIG. 5). Gallium arsenide is grown on exposed surface 11 of substrate 10 by chemical beam epitaxy using tri-isopropylgallium and arsine as the source materials. In this specific example, tri-isopropylgallium is used because it allows for lower growth temperatures that are more compatible with the resistless oxide film 20. Other possible processes include, for example, the use of triethylgallium and arsine on a nitride patterned substrate at a substrate temperature of approximately 620° C.

Figure 8:
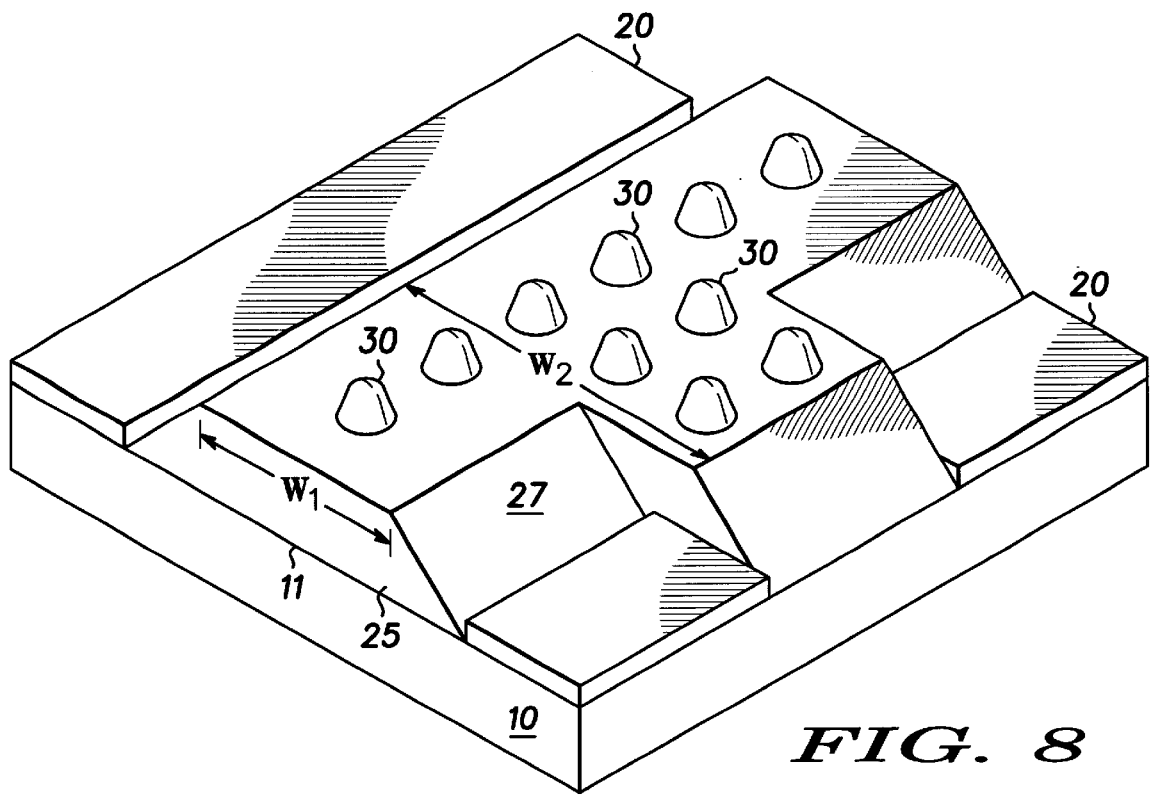
FIG. 8 is a greatly enlarged orthogonal view of a sparse-carrier device, in accordance with the present invention.

By carefully controlling the amount of growth, the crystalline structure illustrated in FIG. 6 is grown with an upper facet 26 having a first width W1 of, in a specific example, approximately 200 nm to correspond with first width A, and a second width W2 somewhat greater than 200 nm to correspond with second width B as shown in FIG. 8. Two other facets 27 and 28, connecting facet 26 to the substrate, are also grown but, as will be explained, not used. The limits on the widths W1 and W2 of facet 26 are related to the quantum dot diameter and desired density. The lower limit for width W1 is equal to a quantum dot diameter, and the lower limit of width W2 is equal to a plurality (such as at least two) of quantum dot diameters. In principle, only one row of quantum dots may be formed on width W1 and a plurality of rows of quantum dots may be formed on width W2 if width W1 and width W2 are less and greater than, respectively, the average dot-to-dot distance, d, given by $d=1/(p)^{1/2}$, where p is the areal dot density.

For example, d=100 nm if $p=1 * 10^{10} cm^2$. Both the quantum dot diameter and the density are influenced by the growth conditions. It should be noted that too much material 25 (i.e., crystalline growth) results in a peak (no upper facet 26) and too little material 25 results in too wide a facet 26 at widths W1 and W2. Further, in this specific embodiment, the crystalline structure is arranged so that upper facet 26 is the (100) facet of the GaAs. It is expected that other facets and/or facets directed other than upwardly, may be used in other applications and the present embodiment-is utilized only for the purposes of explanation.

As an example of the growth of material 25, distance A is 1 micron. As material 25 is grown, it is reduced to approximately 0.1 micron as side or connecting facets 27 and 28 develop. Width B is achieved by forming extension 40 in the desired location of approximately 0.1 micron in width. As material 25 is grown, width A is reduced to width W1 (0.1 micron). Width B includes width A with the additional extension 40 formed adjacent thereto. Distance B is reduced by the reduction of distance A to W1 (0.1 micron) plus the additional width of extension 40. The additional width of extension 40 is not decreased by the growth of material 25 due to the crystallographic orientation. In other words, the material of extension 40 grows parallel to facet 27 (the angle of the facet remains fixed), and therefore maintains its original width. Thus a small change in the difference between distance A and B results in a relatively large change in the difference between W1 and W2.

While the crystal material utilized in this specific application produces crystallographic facets generally as shown in the figures, it will be understood by those skilled in the art that other crystalline structures or combinations of crystalline structures can be grown and utilized. For example, crystalline structures in which the outer facets grow perpendicular to the surface of the substrate, or facets which grow at a negative angle (i.e. the upper surface becomes larger than the interface at the substrate), could also be utilized.

Figure 7:
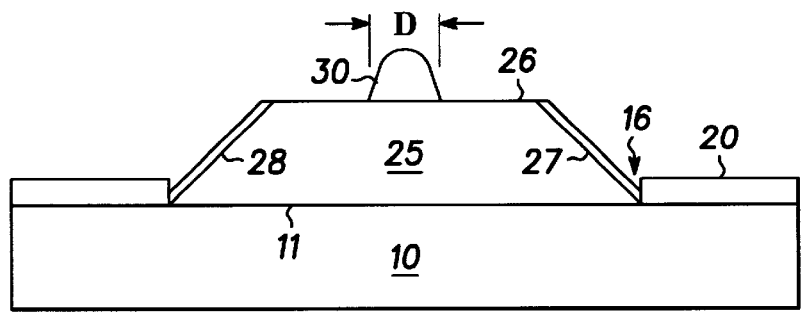
FIG. 7 is a greatly enlarged, simplified sectional view illustrating crystalline material selectively grown on a facet of the crystalline material illustrated in FIG. 6, in accordance with the present invention.

Turning now to FIG. 7, and with continuing reference to FIG. 8, a second crystalline material is selectively grown on facet 26 of crystal material 25. In a specific example, indium arsenide was selectively grown using trimethyl indium and arsine in a chemical beam epitaxy. The growth rates of InAs are different on the various GaAs facets and, utilizing this fact, InAs grows only on the (100) facet thick enough for strain-induced islanding to occur and a quantum structure herein referred to as a quantum dot 30 is produced. Quantum dot 30 is a small particle of material, e.g., semiconductor material, that is small enough to be quantum confined in three dimensions. That is, quantum dot 30 has a diameter, D, that is less that about 200Å. This creates a three dimensional well with quantum confinement in all directions. Indium arsenide growth on facets 27 and 28 is either too slow or non-existent so that no strain-induced islanding can occur on these facets. The ability to avoid InAs growth on oxide layer 20 and the amount of InAs that nucleates on other facets (e.g., facets 27 and 28) are strongly dependent on the growth conditions.

In this specific example, the temperature of the substrate was lowered to approximately 525° C. and, using trimethylindium as the source, indium was delivered onto facet 26 together with arsine in a multiple of cycles each lasting 6–10 seconds long. While a multiple cycle process was used in this example, it should be understood that a continuous deposition can be utilized if desired. The fluxes on In and As delivered in each cycle were equivalent to that which would provide the growth of a fraction of a monolayer (ML) of In As on an unpatterned wafer. The flux levels and the total number of cycles thus determine the total amounts delivered to facet 26. During the second half of each cycle, only arsine was delivered to facet 26 to allow the surface to approach equilibrium conditions. In the example of InAs quantum dots formed on GaAs, the diameter D is typically 30 nm or less with a height of approximately 7–8 nm. Also, the quantum dots are formed with a specific distribution pattern. For purposes of the application, the term distribution pattern includes size of dots, density of the dots (e.g. approximately $10^9$–$10^{10}$ quantum dots/cm$^2$), position, etc. Deposition of additional mismatched material results in coalescence of individual quantum dots and formation of dislocations.

It should be understood that the formation of the quantum dots on an unlimited surface occurs in a generally random location. However, the quantum dot distribution pattern for given growth conditions is, to a large extent, a function of the facet width. For a given total indium (In) flux (for example) delivered to the surface, the areal density of the quantum dots decreases with the facet width. Also, it has been found that the rate of decrease in the quantum dot density is relatively high as the facet width is decreased but slows for facets less than approximately 1.5 m wide. Thus, by adjusting the widths W1 and W2 of facet 26, a row of quantum dots 30 approximately one quantum dot wide and a plurality of quantum dots long may be produced along the length of facet 26 at W1, and a plurality of rows of quantum dots 30 approximately one quantum dot wide and a plurality of quantum dots long may be produced along the length of facet 26 at W2, as illustrated in FIG. 8. It should be understood that a row more than one quantum dot wide, or more than one row, may be grown at W1 of facet 26, and even more so, by comparison, at W2 of facet 26 if so desired in accordance with the present teachings.

Generally, in the example described and illustrated in FIG. 8, electrons introduced at one end of the quantum dots 30 will migrate or tunnel to the opposite end of the proper potentials are applied. While electrons are the prime carrier in this example, it is expected that structures utilizing holes as the carriers could also be fabricated using the precepts described herein. Also, in some approaches, no carriers travel down the chain, only polarization states change and the effect propagates along the chain. By patterning the oxide (see FIGS. 1–4) to form desired paths and structures, various sparse-carrier devices can be fabricated. Furthermore, by providing a facet having varying widths along a predetermined length thereof, the relative size and densities (distribution pattern) of quantum dots may be correspondingly controlled to vary along a predetermined length thereof for the manufacture of varying types of sparse-carrier devices.

Figure 9:
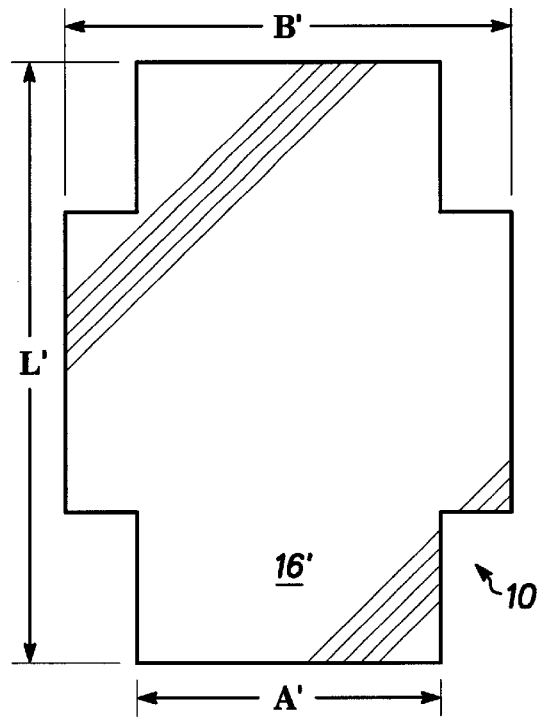
FIG. 9 is a greatly enlarged, simplified top elevational view of another substrate patterned for processing, in accordance with the present invention.
Figure 10:
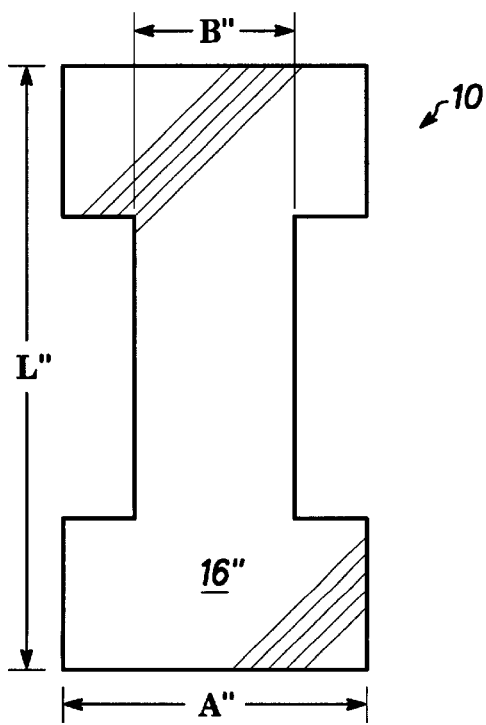
FIG. 10 is a greatly enlarged, simplified top elevational view of a yet still another substrate patterned for processing, in accordance with the present invention.

In this vein, FIGS. 9 and 10 illustrate specifically masked growth areas 16' and 16". In FIG. 9, growth area 16' is formed with a substrate 10 having a length L', a first width A' and a second greater width B' defined by a pair of substantially opposing extensions 41 and 42. In this example, a row of quantum dots 30 approximately one quantum dot wide and a plurality of quantum dots long may be produced along a length of facet of a crystal structure grown therein to correspond with width A', and a plurality of rows of quantum dots 30 approximately one quantum dot wide and a plurality of quantum dots long may be produced along the length of a facet of a crystal structure grown therein to correspond with width B'. It should be understood that a row more than one quantum dot wide, or more than one row, may be grown on a facet to correspond with width A' and even more so, by comparison, to correspond with width B' if so desired.

In FIG. 10 growth area 16" formed with a substrate 10 having a length L", a first width A" and a second lesser width B" defined by a pair of substantially opposing notches 43 and 44. In this example, a one or more rows of quantum dots 30 approximately one quantum dot wide and a plurality of quantum dots long may be produced along a length of facet of a crystal structure grown therein to correspond with width A", and only one row of quantum dots 30 approximately one quantum dot wide and a plurality of quantum dots long may be produced along the length of a facet of a crystal structure grown therein to correspond with width B". In another example, width B" may be of an extent such that after growth of a crystalline structure at 16", the resulting facet will be too narrow for one or more quantum dots to grow.

In summary, deposition of InAs on a selectively formed facet of another material, such as GaAs, forms quantum dots selectively on the facet. The distribution pattern of the quantum dots (density, size, etc.) not only depends on the growth conditions, but also on the size and shape of the facet. Thus, as facet width varies, which may be controlled prior to material deposition in one or more growth areas, from very wide to narrow, the quantum dot distribution pattern varies from zero to multiple quantum dots (many rows) to fewer rows as the facet width decreases to a single row of well separated quantum dots. By varying the width of the facet, quantum dot distribution can thus be controlled to fabricate a large variety of novel and useful device structures. In particular, a very narrow facet width may have all quantum dots connected, and a comparatively wide facet width may have comparatively discreet quantum dots.

Efficient methods of manufacturing, and controlling the manufacture, of sparse electron devices and a great variety of sparse electron devices have been disclosed. Further, while specific examples are utilized herein for purposes of explanation, those skilled in the art will understand that many varieties of materials and forms may be utilized.

The present invention has been described above with reference to preferred embodiments. However, those skilled in the art will recognize that changes and modifications may be made in the described embodiments without departing from the nature and scope of the present invention. Various changes and modifications to the embodiment herein chosen for purposes of illustration will readily occur to those skilled in the art. For instance, although the various embodiments of openings 16, 16' and 16" have been herein disclosed as having two different widths that may be positioned and oriented in any selected fashion along substantially the entire length L, L' and L" thereof, respectively, more than two varying widths may be incorporated as needed for providing more than two facet widths in accordance with specific needs and desires. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of fabricating a sparse-carrier device, the method comprising the steps of:
    providing a crystal substrate of a first material;
    forming a crystal structure having a crystallographic facet on the crystal substrate, the crystallographic facet having a length a first width and a second width wherein said first width differs from said second width;
    depositing quantum dots of a second material on the crystallographic facet along the length thereof in a first distribution pattern along the first width and a second distribution pattern along the second width.

2. The method of claim 1, wherein the step of forming a crystal structure having a crystallographic facet further includes the step of forming the first width to be greater than the second width.

3. The method of claim 1, wherein the step of forming a crystal structure having a crystallographic facet further includes the step of forming the first width to be less than the second width.

4. The method of claim 2 where, in the step of depositing quantum dots of a second material on the crystallographic facet, the first distribution pattern includes a plurality of rows each approximately one quantum dot wide and at least one quantum dot long, and the second distribution pattern includes a row approximately one quantum dot wide and at least one quantum dot long.

5. The method of claim 3 where, in the step of depositing quantum dots of a second material on the crystallographic facet, the first distribution pattern includes a row approximately one quantum dot wide and at least one quantum dot long, and the second distribution pattern includes a plurality of rows each approximately one quantum dot wide and at least one quantum dot long.

6. The method of claim 1, wherein the step of depositing quantum dots further includes the step of covering portions of the crystal substrate, other than the crystal structure, with an oxide.

7. A method of controlling the selected deposition of quantum dots in a sparse-carrier device, the method comprising the steps of:
    providing a crystal substrate of a first material;
    forming an opening in the crystal substrate having a length, a first predetermined width and a second predetermined width, the first predetermined width being different than the second predetermined width;
    forming a crystal structure on the crystal substrate at the opening, the crystal structure including a first crystallographic facet spaced from the crystal substrate and at least one second crystallographic facet joining the first crystallographic facet and the crystal substrate, the first crystallographic facet having a length substantially corresponding to the length of the opening, a first width substantially corresponding to the first predetermined width of the opening and a second width substantially corresponding to the second predetermined width of the opening, the second crystallographic facet forming a fixed angle with the crystal substrate whereby a small percentage change in one of the first and second predetermined widths produces a large percentage of change in the corresponding one of first and second widths; and
    depositing quantum dots of a second material on the first crystallographic facet along the length thereof, the first width of the first crystallographic facet restricting deposition of quantum dots thereon in a first distribution pattern and the second width of the first crystallographic facet restricting deposition of quantum dots thereon in a second distribution pattern.

8. The method of claim 7, wherein the step of forming an opening in the crystal substrate, the first predetermined width is greater than the second predetermined width.

9. The method of claim 7 where, in the step of forming an opening in the crystal substrate, the first predetermined width is less than the second predetermined width.

10. The method of claim 8 where, in the step of depositing quantum dots of a second material on the crystallographic facet, the first distribution pattern includes a greater number of quantum dots than the second distribution pattern.

11. The method of claim 9 where, in the step of depositing quantum dots of a second material on the crystallographic facet, the first distribution pattern includes a lesser number of quantum dots than the second distribution pattern.

12. The method of claim 8 where, in the step of depositing quantum dots of a second material on the crystallographic facet, the first distribution pattern includes a plurality of rows each approximately one quantum dot wide and at least one quantum dot long, and the second distribution pattern includes a row approximately one quantum dot wide and at least one quantum dot long.

13. The method of claim 9 where, in the step of depositing quantum dots of a second material on the crystallographic facet, the first distribution pattern includes a row approximately one quantum dot wide and at lest one quantum dot long, and the second distribution pattern includes a plurality of rows each approximately one quantum dot wide and at least one quantum dot long.

14. The method of claim 7, wherein the step of depositing quantum dots further includes the step of covering portions of the crystal substrate, other than the crystal structure, with an oxide.

* * * * *